(12) United States Patent
Wang et al.

(10) Patent No.: US 10,991,655 B2
(45) Date of Patent: Apr. 27, 2021

(54) E-FUSE AND MANUFACTURING METHOD THEREOF, AND MEMORY CELL

(71) Applicant: SHENZHEN WEITONGBO TECHNOLOGY CO., LTD., Shenzhen (CN)

(72) Inventors: Wenxuan Wang, Shenzhen (CN); Jian Shen, Shenzhen (CN); Hongchao Wang, Shenzhen (CN)

(73) Assignee: SHENZHEN WEITONGBO TECHNOLOGY CO., LTD., Shenzhen (CN)

( * ) Notice: Subject to any disclaimer, the term of this patent is extended or adjusted under 35 U.S.C. 154(b) by 48 days.

(21) Appl. No.: 16/664,787

(22) Filed: Oct. 25, 2019

(65) Prior Publication Data

US 2020/0066636 A1    Feb. 27, 2020

Related U.S. Application Data

(63) Continuation of application No. PCT/CN2018/102311, filed on Aug. 24, 2018.

(51) Int. Cl.
*H01L 23/525* (2006.01)
*H01L 23/528* (2006.01)
*H01L 27/115* (2017.01)

(52) U.S. Cl.
CPC ...... *H01L 23/5256* (2013.01); *H01L 23/5283* (2013.01); *H01L 27/115* (2013.01)

(58) Field of Classification Search
CPC ............. H01L 23/5256; H01L 23/5283; H01L 27/115; H01L 23/5228; H01L 27/11206
See application file for complete search history.

(56) References Cited

U.S. PATENT DOCUMENTS

| | | | |
|---|---|---|---|
| 6,191,432 B1 * | 2/2001 | Sugiyama | ............. H01L 27/115 257/19 |
| 7,666,717 B2 | 2/2010 | Sel et al. | |
| 7,777,297 B2 * | 8/2010 | Yang | ................... H01L 23/5256 257/529 |
| 7,847,370 B2 * | 12/2010 | Kitajima | ................. H01L 28/20 257/529 |

(Continued)

FOREIGN PATENT DOCUMENTS

| CN | 102347309 A | 2/2012 |
|---|---|---|
| CN | 104183542 A | 12/2014 |

(Continued)

*Primary Examiner* — John P. Dulka

(57) ABSTRACT

An e-fuse and a manufacturing method thereof, and a memory cell are provided. The method includes: providing a semiconductor substrate including a preset active region; forming an isolating region on the substrate, where the isolating region and the preset active region have a height difference and are connected by at least one side wall; forming a negative electrode and a positive electrode on the preset active region; and forming a fuse link on the side wall for connecting the negative electrode and the positive electrode. Accordingly, the line width of the fuse link is out of the limitation of the limit line width of the semiconductor process, the actual line width of the e-fuse may be smaller than the limit line width of the semiconductor process, and low fusing current is required for fusing.

20 Claims, 12 Drawing Sheets

(56) References Cited

U.S. PATENT DOCUMENTS

| | | | |
|---|---|---|---|
| 7,892,926 B2* | 2/2011 | Barth | H01L 23/5256 438/281 |
| 8,952,486 B2* | 2/2015 | Yang | H01L 23/5256 257/529 |
| 9,093,453 B2* | 7/2015 | Li | H01L 23/5256 |
| 9,230,925 B2* | 1/2016 | Choi | H01L 23/5256 |
| 9,627,314 B2* | 4/2017 | Choi | H01L 23/5256 |
| 10,644,010 B2* | 5/2020 | Gan | H01L 21/823431 |
| 2001/0042897 A1* | 11/2001 | Yeh | H01L 23/5256 257/529 |
| 2004/0219720 A1* | 11/2004 | Jeng | H01L 23/5258 438/131 |
| 2007/0159745 A1* | 7/2007 | Berberich | H02H 5/04 361/59 |
| 2008/0185678 A1* | 8/2008 | Kitajima | H01L 28/20 257/529 |
| 2008/0237786 A1* | 10/2008 | Yang | H01L 23/5256 257/529 |
| 2009/0294901 A1* | 12/2009 | Bonilla | H01L 23/5256 257/529 |
| 2011/0074538 A1* | 3/2011 | Wu | H01L 23/5256 337/187 |
| 2012/0112311 A1 | 5/2012 | Cho et al. | |
| 2012/0256267 A1* | 10/2012 | Li | H01L 29/66545 257/369 |
| 2012/0261793 A1* | 10/2012 | Yang | H01L 23/5256 257/529 |
| 2015/0076655 A1* | 3/2015 | Choi | H01L 23/53238 257/529 |
| 2015/0097266 A1* | 4/2015 | Li | H01L 21/7684 257/529 |
| 2015/0200196 A1* | 7/2015 | Ponoth | H01L 29/66545 257/379 |
| 2016/0071582 A1* | 3/2016 | Chung | G11C 13/0004 365/96 |
| 2016/0141179 A1* | 5/2016 | Wu | H01L 21/76843 257/288 |
| 2018/0061757 A1* | 3/2018 | Li | H01L 21/823431 |
| 2018/0061846 A1* | 3/2018 | Gan | H01L 23/5256 |
| 2020/0066636 A1* | 2/2020 | Wang | H01L 23/5283 |

FOREIGN PATENT DOCUMENTS

| | | |
|---|---|---|
| CN | 106449594 A | 2/2017 |
| CN | 106531718 A | 3/2017 |
| JP | 2009267371 A | 11/2009 |
| KR | 20080061933 A | 7/2008 |

* cited by examiner

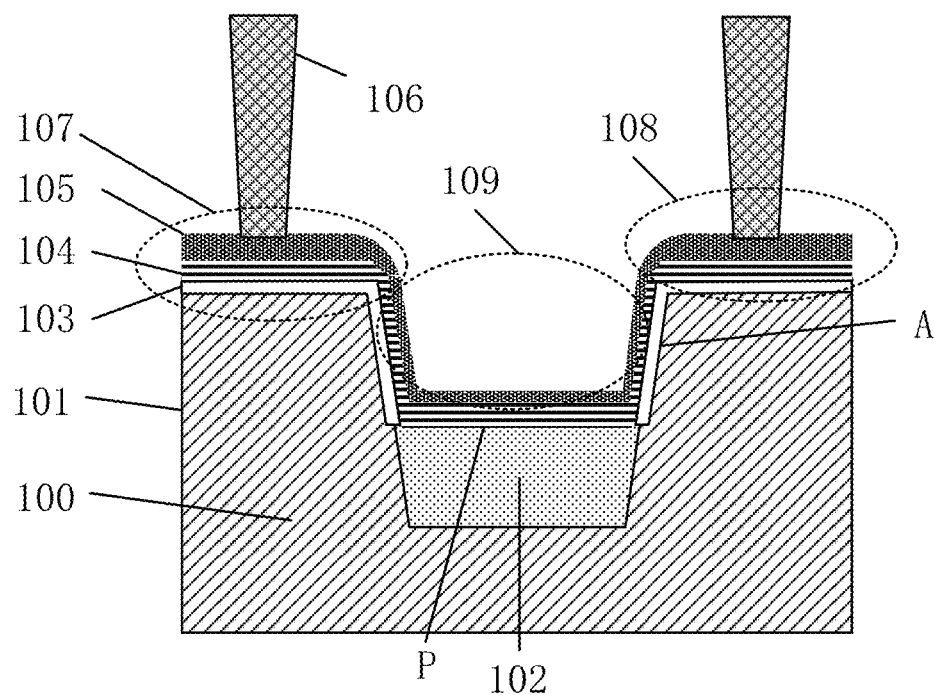

FIG. 1C

```
┌─────────────────────────────────────────────────────────┐
│ Provide a semiconductor substrate, the semiconductor    │─S201
│         substrate including a preset active region      │
└─────────────────────────────────────────────────────────┘
                            │
┌─────────────────────────────────────────────────────────┐
│ Form an isolating region on the semiconductor substrate,│
│ where the isolating region and the preset active region │─S202
│ have a height difference and are connected by at least  │
│                 one side wall                           │
└─────────────────────────────────────────────────────────┘
                            │
┌─────────────────────────────────────────────────────────┐
│ Form a negative electrode and a positive electrode on   │─S203
│              the preset active region                   │
└─────────────────────────────────────────────────────────┘
                            │
┌─────────────────────────────────────────────────────────┐
│ Form fuse links on the At least one side wall for       │─S204
│ connecting the negative electrode and the positive      │
│                      electrode                          │
└─────────────────────────────────────────────────────────┘
```

FIG. 2

E-FUSE AND MANUFACTURING METHOD THEREOF, AND MEMORY CELL

CROSS REFERENCE TO RELATED APPLICATIONS

The present application is a continuation of international application No. PCT/CN2018/102311, filed on Aug. 24, 2018, which is hereby incorporated by reference in its entirety

TECHNICAL FIELD

Embodiments of the present disclosure relate to the field of semiconductor technology, and specifically to an e-fuse and a manufacturing method thereof, and a memory cell.

BACKGROUND

The electrically programmable fuse (e-fuse) has the advantages of simple structure, low cost and high reliability, and therefore has been widely used in MOS chips as an important part of non-volatile programmable memories, for example, used to implement redundancy functions in memory arrays and permanently save information such as chip IDs.

The e-fuse can be programmed by switching between a low resistance state and a high resistance state, based on the principle that electro-migration of fuse links contained in the e-fuse occurs under the drive of a certain magnitude of current, resulting in transition of the e-fuse from a low resistance state to a high resistance state, and the process is irreversible. Since the programming process is realized by current injection, the programming can be implemented after a chip is packaged, which greatly enlarges its application range.

The e-fuse specifically includes negative and positive electrodes and fuse links for electrically connecting the negative and positive electrodes. The width of the e-fuse is determined by the line width of the fuse links. However, the structure of the conventional e-fuse is limited by the limit line width of the semiconductor process, and the limit width of the fuse links cannot be smaller than the limit line width of the semiconductor process, that is, the actual line width of the e-fuse is not smaller than the limit line width of the semiconductor process, or the actual line width of the fuse links is greater than their theoretical line width.

In the case of a certain process capability, under the limitation of the large actual line width of the e-fuse, the e-fuse can be completely fused as long as the fusing current reaches a certain magnitude, thereby achieving the programming effect. Further, in order to provide the current capable of meeting the fusing requirement of the e-fuse, the size of the transistor structure as its control unit should also meet certain requirement. As a result, the single memory cell including the e-fuse occupies a large area, which reduces the storage capacity of the memory.

SUMMARY

In view of this, one of the technical problems to be solved by the embodiments of the present disclosure is to provide an e-fuse and a manufacturing method thereof, and a memory cell for overcoming or alleviating the above defects in the related art.

An embodiment of the present disclosure provides a method for manufacturing an e-fuse, including:

providing a semiconductor substrate, the semiconductor substrate including a preset active region;

forming an isolating region on the semiconductor substrate, where the isolating region and the preset active region have a height difference and are connected by at least one side wall;

forming a negative electrode and a positive electrode on the preset active region; and forming a fuse link on the side wall for connecting the negative electrode and the positive electrode.

An embodiment of the present disclosure provides an e-fuse, including a semiconductor substrate, a negative electrode, a positive electrode, and a fuse link for electrically connecting the negative electrode and the positive electrode; the semiconductor substrate includes a preset active region, and the negative electrode and the positive electrode are formed on the preset active region; an isolating region is formed on the semiconductor substrate, the isolating region and the preset active region have a height difference and are connected by at least one side wall, and the fuse link is formed on the at least one side wall.

An embodiment of the present disclosure provides a memory cell, including the e-fuse described in any embodiment.

In the embodiments of the present disclosure, the e-fuse includes a semiconductor substrate, a negative electrode, a positive electrode, and a fuse link for electrically connecting the negative electrode and the positive electrode; the semiconductor substrate includes a preset active region, and the negative electrode and the positive electrode are formed on the preset active region; an isolating region is formed on the semiconductor substrate, the isolating region and the preset active region have a height difference and are connected by at least one side wall, and the fuse link is formed on the at least one side wall, so that the line width of the fuse link is out of the limitation of the limit line width of the semiconductor process, the actual line width of the e-fuse may be smaller than the limit line width of the semiconductor process, especially the limitation of the limit line width is eliminated under the same semiconductor process platform to realize small actual line width of the e-fuse, and low fusing current is required for fusing. Further, the transistor structure as its control unit is also small, thereby reducing the area occupied by a single memory cell, and improving the storage capacity of a memory.

BRIEF DESCRIPTION OF THE DRAWINGS

Some specific embodiments of the present disclosure are described in detail hereinafter in an exemplary manner instead of a non-limitative manner with reference to the accompanying drawings. In the drawings, like reference numerals denote like or similar parts or elements. A person skilled in the art should understand that these drawings are drawn to scale. Among the drawings:

FIG. 1C is a cross-sectional structural diagram of the e-fuse in the embodiment of FIG. 1A in the Y direction;

FIG. 2 is a schematic flowchart of a method for manufacturing an e-fuse according to a second embodiment of the present disclosure;

DETAILED DESCRIPTION

Nevertheless, it is not necessary to require that any technical solution according to the embodiments of the present disclosure achieves all of the above technical effects.

For better understanding of the technical solutions according to the embodiments of the present disclosure by a person skilled in the art, the technical solutions of the present disclosure are clearly and completely described with reference to the accompanying drawings of the embodiments of the present disclosure. Apparently, the described embodiments are only a part of the embodiments of the present disclosure, rather than the entire embodiments. Based on the embodiments of the present disclosure, all other embodiments derived by persons of ordinary skill in the art without any creative effort shall fall within the protection scope of the present disclosure.

Specific implementations of the present disclosure are further described hereinafter with reference to drawings of the embodiments of the present disclosure.

The e-fuse provided in the following embodiments of the present disclosure may structurally include a semiconductor substrate, a negative electrode, a positive electrode, and fuse links for electrically connecting the negative electrode and the positive electrode; the semiconductor substrate includes a preset active region, and the negative electrode and the positive electrode are formed on the preset active region; an isolating region is formed on the semiconductor substrate, the isolating region and the preset active region have a height difference and are connected by at least one side wall, and the fuse links are formed on the at least one side wall.

The fusing of the fuse links is not physically broken, but is actually a state of migration of a metal on the surface of the fuse caused by electro-migration to form a high resistance state.

Correspondingly, in order to manufacture the e-fuse with the above structure, the manufacturing method provided in the following embodiments of the present disclosure may specifically include the following steps: providing a semiconductor substrate, the semiconductor substrate including a preset active region; forming an isolating region on the semiconductor substrate, where the isolating region and the preset active region have a height difference and are connected by at least one side wall; forming a negative electrode and a positive electrode on the preset active region; and forming fuse links on the at least one side wall for connecting the negative electrode and the positive electrode.

In order to clearly illustrate an e-fuse and a manufacturing method thereof, and a memory cell in the embodiments of the present disclosure, four different e-fuse structures and corresponding manufacturing methods will be exemplified below.

Figure 1A:
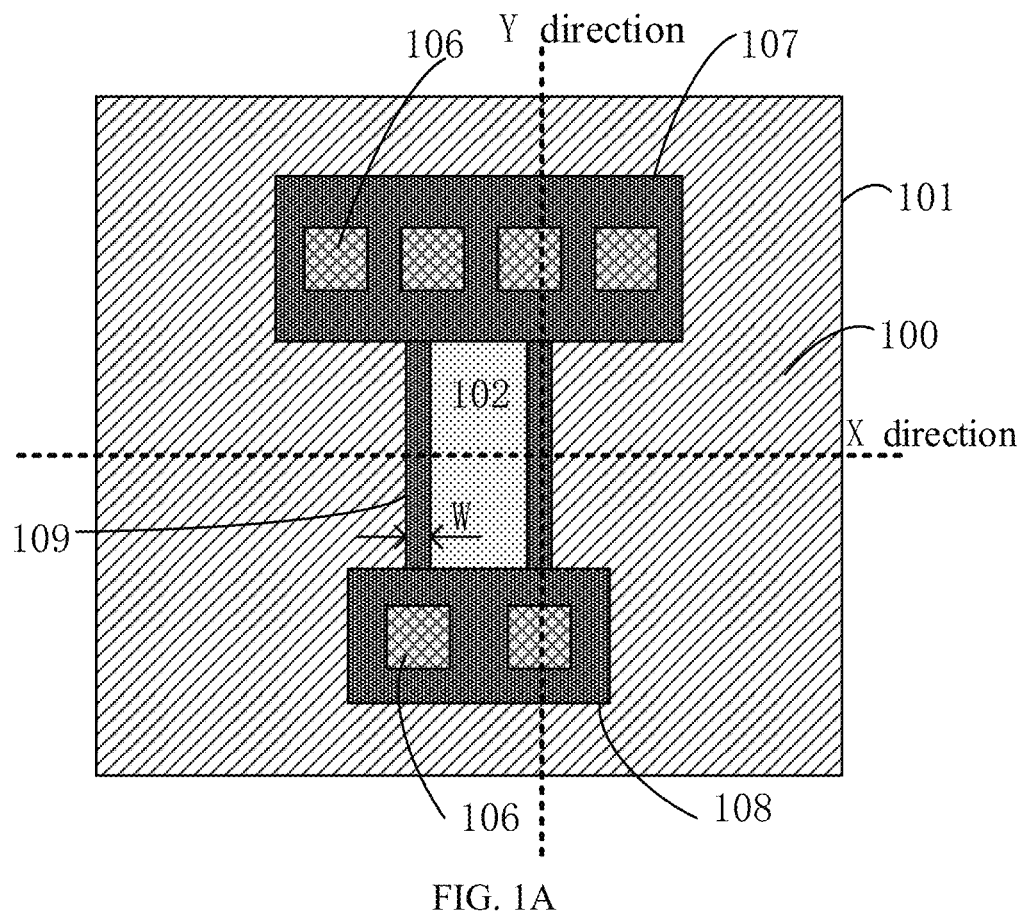
FIG. 1A is a planar structural diagram of an e-fuse according to a first embodiment of the present disclosure.
Figure 1B:
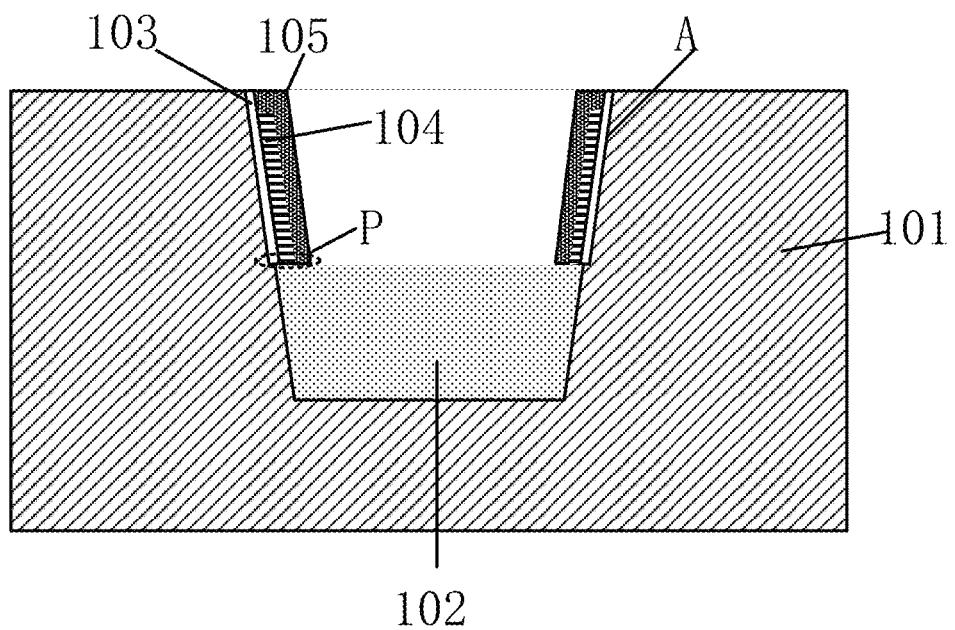
FIG. 1B is a cross-sectional structural diagram of the e-fuse in the embodiment of FIG. 1A in the X direction.

FIG. 1A is a planar structural diagram of an e-fuse according to a first embodiment of the present disclosure; FIG. 1B is a cross-sectional structural diagram of the e-fuse in the embodiment of FIG. 1A in the X direction. In this embodiment, the fusing current is exemplified in the X direction. FIG. 1A illustrates the specific structure of the e-fuse from top view, and FIG. 1B illustrates the specific structure of the e-fuse in the X direction from cross-sectional view.

As shown in FIGS. 1A and 1B, a semiconductor substrate 101 has an isolating region 102 and a preset active region 100. A negative electrode 107 and a positive electrode 108 are formed on the preset active region 100. Since the fusing current is in the Y direction, the negative electrode 107 and the positive electrode 108 are located on the upper and lower sides as viewed from FIG. 1A. Fuse links 109 are formed between the preset active region 100 and the isolating region 102. As shown in FIG. 1B, the fuse links 109 may include an oxide layer 103, a polysilicon layer 104, and a metal silicide layer 105. The width of the fuse links 109 is in the X direction as shown by W in FIG. 1A.

In other embodiments, if the fusing current flows in the X direction, the line width of the e-fuse is the width in the Y direction, and the negative electrode 107 and the positive electrode 108 are located on the left and right sides as shown in FIG. 1A.

Further, in this embodiment, the e-fuse further includes connecting units 106 for connecting the e-fuse with external circuits. In this embodiment, the number of the connecting units 106 is determined based on the demand of connection with external circuits, and the amount of current required to pass. In this embodiment, exemplarily, two connecting units 106 are disposed on the positive electrode 108, and four connecting units 106 are disposed on the negative electrode 107.

As shown in FIG. 1B, since the fusing current is in the Y direction, it can be seen from the cross-sectional structural diagram in the X direction that the oxide layer 103, the polysilicon layer 104, and the metal silicide layer 105 are disposed on the left and right side walls A between the preset active region 100 and the isolating region 102, the metal silicide layer 105 is on the upper surface of the polysilicon layer 104, or the metal silicide layer 105 covers the surface of the polysilicon layer 104.

In this embodiment, the fuse links 109 are also formed at the junctions P between the isolating region 102 and the preset active region 100 in the X direction.

Referring to FIG. 1B, a height difference is formed between the preset active region 100 and the isolating region 102, or the preset active region 100 is not in the same plane as the upper surface (or the highest surface) of the isolating region 102, and side walls A are formed between the preset active region 100 and the isolating region 102. Viewed from the X direction, a trapezoidal region may be formed between the preset active region 100 and the isolating region 102 by means of the height difference. If viewed in the direction of the fusing current, that is, the Y direction, since the preset active region 100 and the isolating region 102 have the height difference, the fuse links have approximately vertical sharp angles, and the electric field may concentrate here when the fusing current is applied, which makes the fusing here easier and greatly reduces the required fusing current.

FIG. 1C is a cross-sectional structural diagram of the e-fuse in the embodiment of FIG. 1A in the Y direction. As shown in FIG. 1C, in this embodiment, the negative electrode 107, the positive electrode 108, and the fuse links 109 are made of the same material and have the same layer structure as an example, that is, as viewed from FIG. 1C, the fuse links 109 extend from one end of the negative electrode 107, and the adjacent left and right junctions P of the isolating region 102 and the preset active region 100 to one end of the positive electrode 108 in the Y direction (i.e., the direction of the fusing current), so as to connect the negative electrode 107 and the positive electrode 108. In addition, the connecting units 106 may be disposed on the metal silicide layer 105 in the negative electrode 107 and the positive electrode 108.

In this embodiment, since the preset active region 100 and the isolating region 102 have the height difference, the preset active region 100 and the isolating region 102 have a stepped region (active region—side wall—isolating region—side wall—active region) viewed in the direction of the fusing current, so that the fuse links have approximately vertical sharp angles.

In this embodiment, as described above, the negative electrode 107, the positive electrode 108, and the fuse links 109 are made of the same material and have the same layer structure, specifically, each includes an oxide layer, a polysilicon layer, and a metal silicide layer, that is, the positive electrode 108 includes an oxide layer 103, a polysilicon layer 104, and a metal silicide layer 105, the metal silicide layer 105 being disposed on the upper surface of the polysilicon layer 104; similarly, the negative electrode 107 also includes an oxide layer 103, a polysilicon layer 104, and a metal silicide layer 105, the metal silicide layer 105 being disposed on the upper surface of the polysilicon layer 104; the fuse links 109 also include an oxide layer 103, a polysilicon layer 104, and a metal silicide layer 105, the metal silicide layer 105 being disposed on the upper surface of the polysilicon layer 104; the negative electrode 107 and the positive electrode 108 may be formed synchronously by the same process when the fuse links 109 are formed, or the fuse links 109 may be formed synchronously by the same process when the negative electrode 107 and the positive electrode 108 are formed, thereby simplifying the process steps and reducing the production cost.

However, in other embodiments, for a person of ordinary skill in the art, if the negative electrode 107, the positive electrode 108, and the fuse links 109 are made of different materials and have different layer structures, the negative electrode 107, the positive electrode 108, and the fuse links 109 may be formed in steps by different processes. For example, after a trench for disposing the isolating region 102 is formed, the negative electrode 107 and the positive electrode 108 are formed in the preset active region 100, and then the fuse links are formed; or the fuse links 109 are formed first, and then the negative electrode 107 and the positive electrode 108 are formed.

The method for manufacturing the e-fuse shown in FIGS. 1A to 1C will be exemplarily interpreted through FIG. 2 and the schematic structural diagrams of the respective steps.

FIG. 2 is a schematic flowchart of a method for manufacturing an e-fuse according to a second embodiment of the present disclosure. As shown in FIG. 2, the method includes the following steps S201-S204.

S201, a semiconductor substrate is provided, the semiconductor substrate including a preset active region.

In this embodiment, the semiconductor substrate may be formed by undoped monocrystal silicon, doped monocrystal silicon, silicon-on-insulator (SOI), silicon carbide or the like. Specifically, the semiconductor substrate used in this embodiment is, for example, a P-type silicon substrate.

S202, an isolating region is formed on the semiconductor substrate, where the isolating region and the preset active region have a height difference and are connected by at least one side wall.

Specifically, in this embodiment, a trench extending downward from an upper surface of the semiconductor substrate is formed, a bottom surface of the trench forms the isolating region, and a side wall of the trench is used to connect the isolating region with the preset active region. In a specific application scenario, forming a trench extending downward from an upper surface of the semiconductor substrate by photolithography and etching. In a specific application scenario, the trench may be first filled with an isolating medium such as an oxide; then part of the isolating medium in the trench is removed, and the isolating region and the preset active region are caused to have a height difference and to be connected by at least one side wall. In this embodiment, the trench is a square-shaped trench, the square-shaped trench is filled with an isolating medium to form an isolating region, thereby forming one isolating region and one preset active region, for example, the isolating region is surrounded by the preset active region.

Further, the square-shaped trench is filled with an isolating medium on the semiconductor substrate by a standard MOS isolating region process, the isolating medium may be a Shallow Trench Isolation (STI) oxide, or a field oxide generated by a Local Oxidation of Silicon (LOCOS) process, or the like, and then part of the oxide in the trench is removed to form the isolating region. Specifically, in this embodiment, the isolating region is a shallow trench isolating region.

Specifically, after the trench is filled with the isolating medium, a photoresist opening is formed in the region where the fuse links are formed, and then quantitative etching is performed until the remaining isolating medium has a thickness required to isolate devices on the same substrate, that is, part of the isolating medium in the isolating region is removed, so that the preset active region and the isolating region directly have a height difference, or the preset active region and the upper surface of the isolating region are not in the same plane.

In this embodiment, since the region where the fuse links are to be disposed is not shielded by a photoresist layer during etching after the trench is filled with the isolating medium, only the isolating medium in the region where the fuse links are to be disposed is etched, and then the isolating region and the preset active region having a height difference, and the side walls between the preset active region and the isolating region are formed.

In a specific application scenario, a wet oxide etching process may be specifically used, and a hydrofluoric acid solution (for example, having a concentration of 1%) or a Buffered Oxide Etch (BOE) solution in a set concentration ratio may be used for etching. The BOE may be specifically prepared by mixing hydrofluoric acid (49%) with water or ammonium fluoride with water. The wet oxide etching using the hydrofluoric acid solution or the BOE here is merely an example, but not a limitation.

However, if the limitation of the process is neglected or the cost of the process is not considered, the trench may be directly filled with part of oxide, so that the isolating region and the preset active region have a height difference and are connected by at least one side wall.

S203, a negative electrode and a positive electrode are formed on the preset active region.

S204, fuse links are formed on the side walls for connecting the negative electrode and the positive electrode.

When the fuse links include the oxide layer, the polysilicon layer and the metal silicide layer, the oxide layer, the polysilicon layer and the metal silicide layer are sequentially formed on the side walls to form the fuse links when the fuse is formed. The polysilicon layer is etched to form a residual or parasitic polysilicon layer, and the metal silicide layer is formed on the surface of the residual or parasitic polysilicon layer. The metal silicide layer may include at least one of a titanium metal silicide, a cobalt metal silicide, and a tungsten metal silicide.

As described above, in consideration of the process cost, the negative electrode, the positive electrode and the fuse links are made of the same material and have the same layer structure, that is, for each layer of the three-layer structure (i.e., the oxide layer 103, the polysilicon layer 104, and the metal silicide layer 105), the negative electrode, the positive electrode and the fuse links are made of the same material. Thus, when the fuse links are formed, the oxide layer 103, the polysilicon layer 104, and the metal silicide layer 105 constituting the negative electrode and the positive electrode are synchronously formed by the same process.

In this embodiment, the fuse links, the negative electrode, and the positive electrode may be synchronously formed by an MOS manufacturing process, for example, the oxide layer 103 is formed on the upper surface of the active region and the side walls by Low Pressure Chemical Vapor Deposition (LPCVD), and then the polysilicon layer 104 is deposited on the oxide layer 103, where the thickness of the deposited polysilicon layer 104 may be adjusted by controlling the deposition time. Thereafter, the deposited polysilicon layer 104 is etched by MOS polysilicon lithography and etching process.

In this embodiment, since the side walls are formed between the preset active region and the isolating region, after the polysilicon lithography and etching process, a polysilicon (i.e., residual polysilicon layer) or parasitic polysilicon layer that is not completely etched remains on the side walls, and forms a polysilicon side wall structure. Finally, the metal silicide layer is formed on the surface of the residual or parasitic polysilicon layer. The metal silicide layer may be formed by metallization of polysilicon to ultimately form low resistance fuse links. At the same time, the positive electrode and the negative electrode are formed synchronously. The metallization of polysilicon may be carried out by an MOS standard polysilicon metallization process.

In this embodiment, since the negative electrode, the positive electrode, and the fuse links are made of the same material and have the same layer structure, the above steps S203 and S204 are performed synchronously. However, as described above, if the negative electrode, the positive electrode and the fuse links are made of different materials and have different layer structures, steps S203 and S204 may be performed separately, for example, after the trench is formed, the negative electrode and the positive electrode are formed in the active region; or, after the fuse links are formed, the negative electrode and the positive electrode are formed in the active region.

The above manufacturing method will be interpreted below in conjunction with the schematic structural diagrams after respective steps.

Figure 3A:
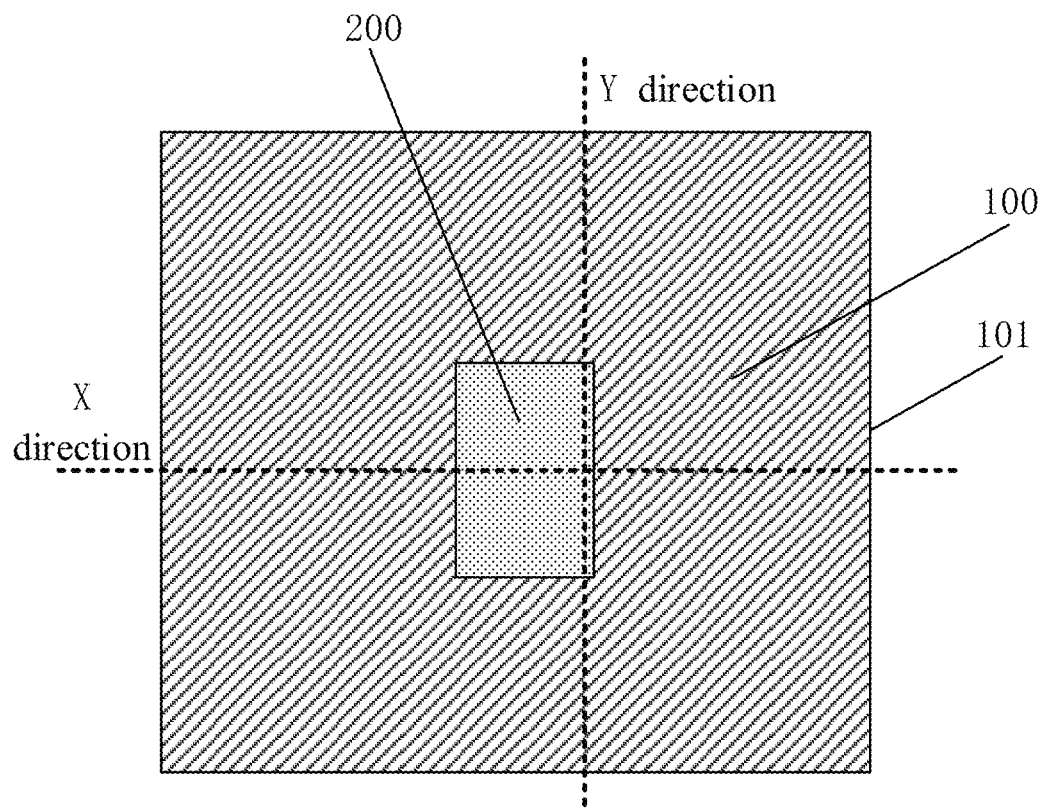
FIG. 3A is a planar structural diagram of a trench and a preset active region formed according to an embodiment of the present disclosure.
Figure 3B:
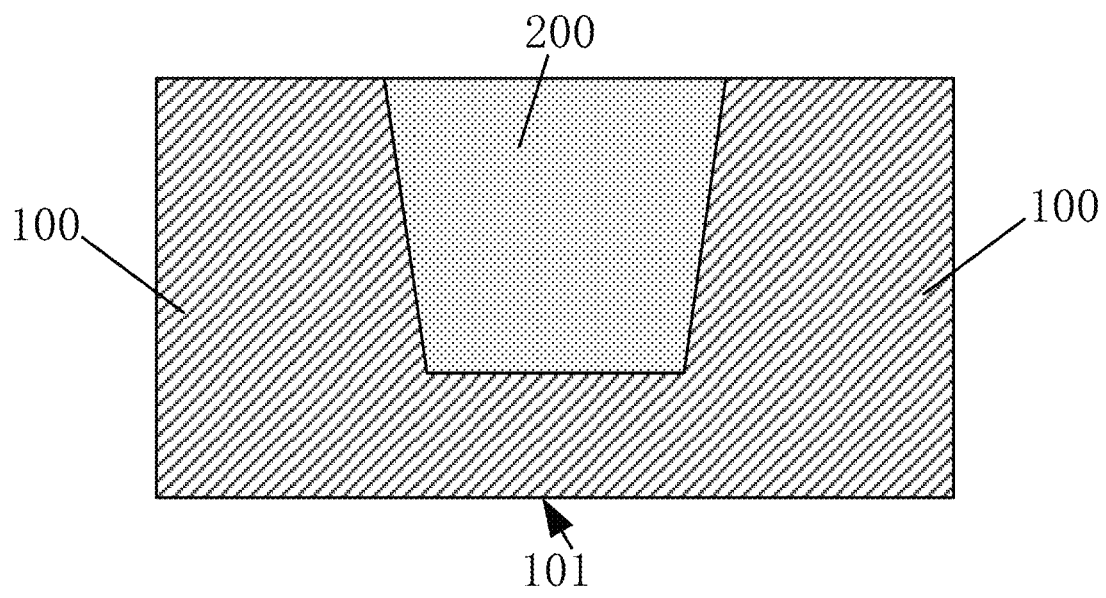
FIG. 3B is a cross-sectional structural diagram of the trench and the preset active region formed according to an embodiment of the present disclosure in the X direction.
Figure 3C:
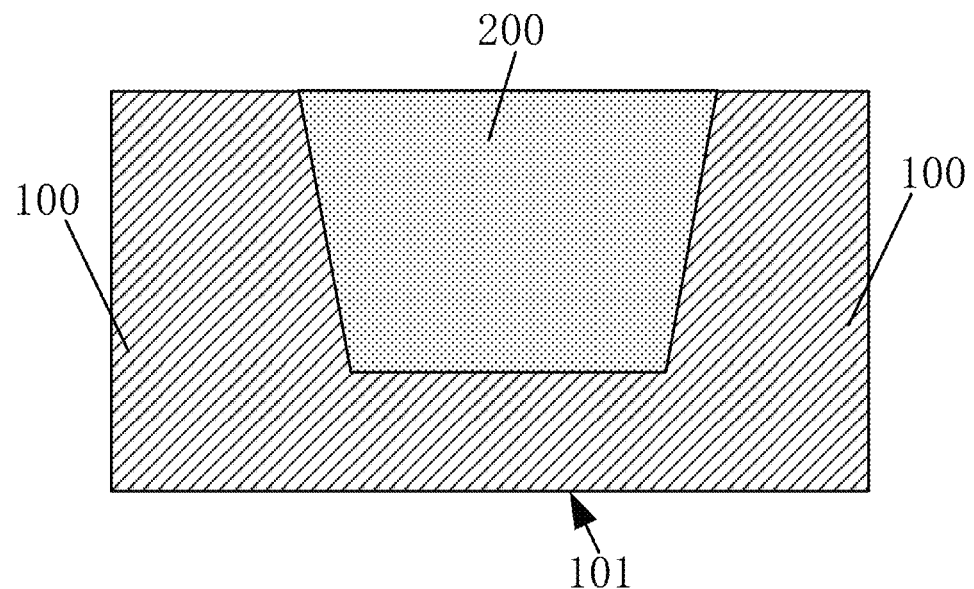
FIG. 3C is a cross-sectional structural diagram of the trench and the preset active region formed according to an embodiment of the present disclosure in the Y direction.

FIG. 3A is a planar structural diagram of a trench and a preset active region 100 formed according to an embodiment of the present disclosure; FIG. 3B is a cross-sectional structural diagram of the trench and the preset active region 100 formed according to an embodiment of the present disclosure in the X direction; FIG. 3C is a cross-sectional structural diagram of the trench and the preset active region 100 formed according to an embodiment of the present disclosure in the Y direction. Referring to FIGS. 3A-3C, the trench is filled with an isolating medium 200. In the actual process, the filling height of the isolating medium 200 may be higher than the upper surface of the preset active region 100. At this time, the height of the filled isolating medium 200 may be processed by grinding to be flush with the upper surface of the preset active region 100.

Figure 3D:
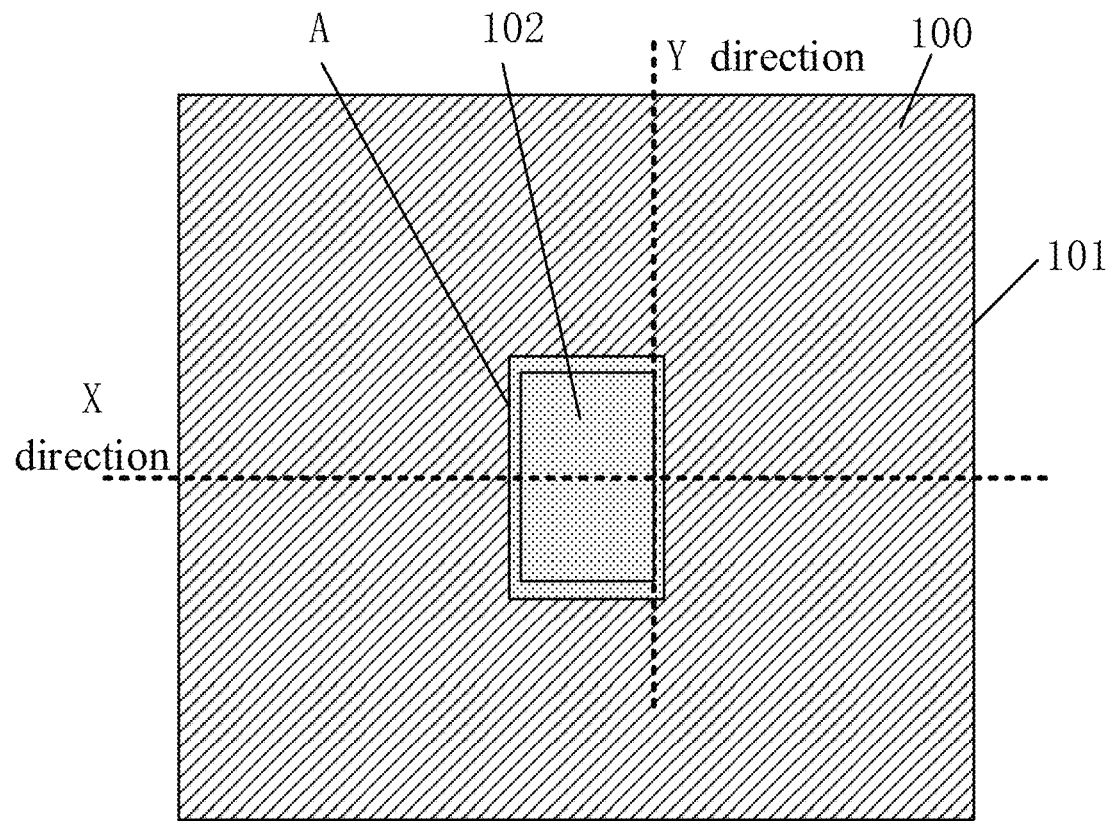
FIG. 3D is a planar structural diagram after removing part of an isolating medium in the trench according to an embodiment of the present disclosure.
Figure 3E:
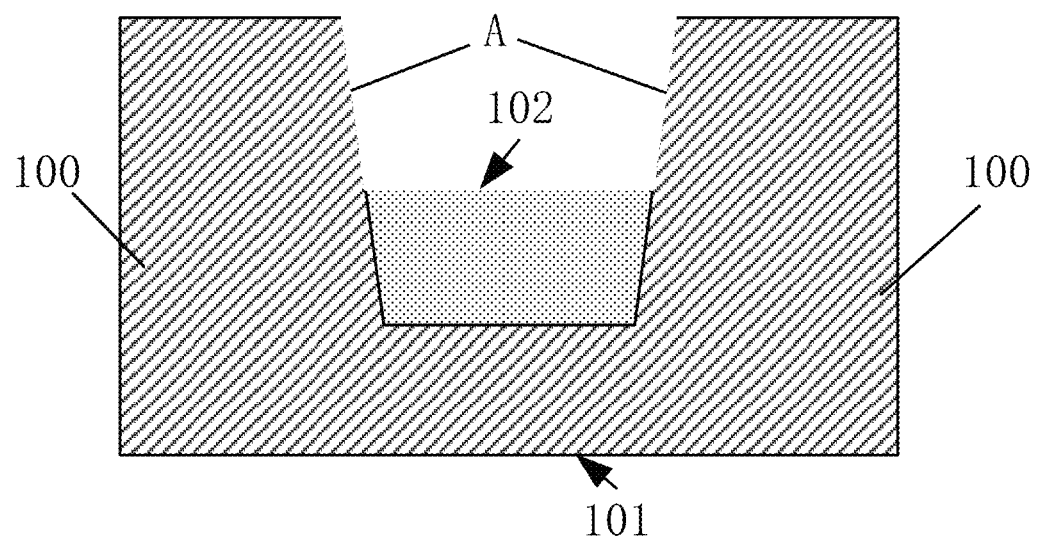
FIG. 3E is a cross-sectional structural diagram after removing part of the isolating medium in the trench according to an embodiment of the present disclosure in the X direction.
Figure 3F:
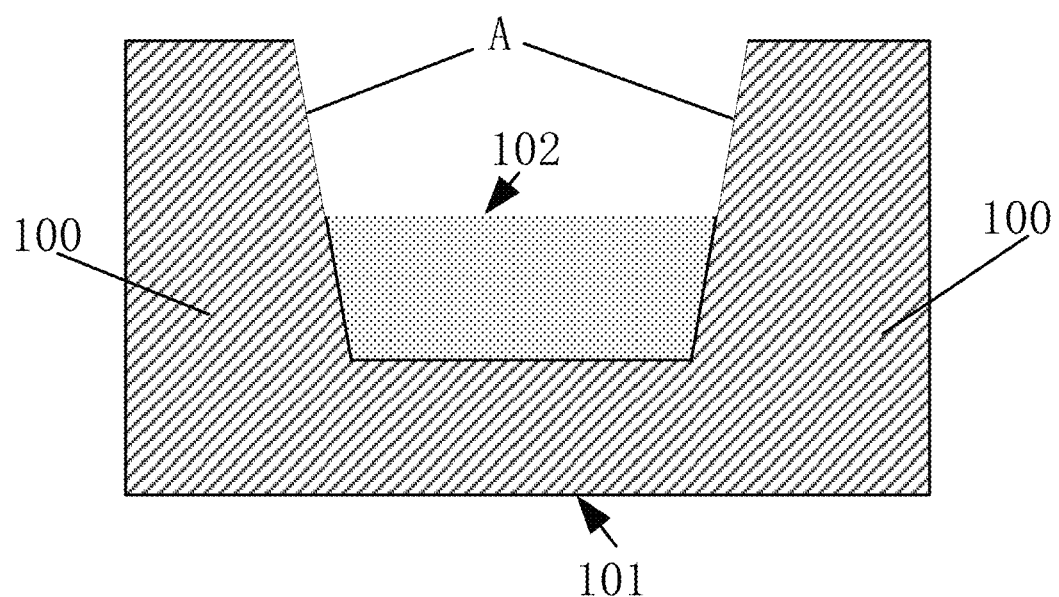
FIG. 3F is a cross-sectional structural diagram after removing part of the isolating medium in the trench according to an embodiment of the present disclosure in the Y direction.

FIG. 3D is a planar structural diagram after removing part of the isolating medium in the trench according to an embodiment of the present disclosure; FIG. 3E is a cross-sectional structural diagram after removing part of the isolating medium in the trench according to an embodiment of the present disclosure in the X direction; FIG. 3F is a cross-sectional structural diagram after removing part of the isolating medium in the trench according to an embodiment of the present disclosure in the Y direction. Referring to FIGS. 3D-3F, the remaining part of the isolating medium 200 in the trench is etched away to form an isolating region 102, so that the preset active region 100 and the isolating region 102 have a height difference, or the preset active region 100 is not in the same plane as the isolating region 102. At the same time, trapezoidal side walls A are formed between the preset active region 100 and the isolating region 102.

Figure 3G:
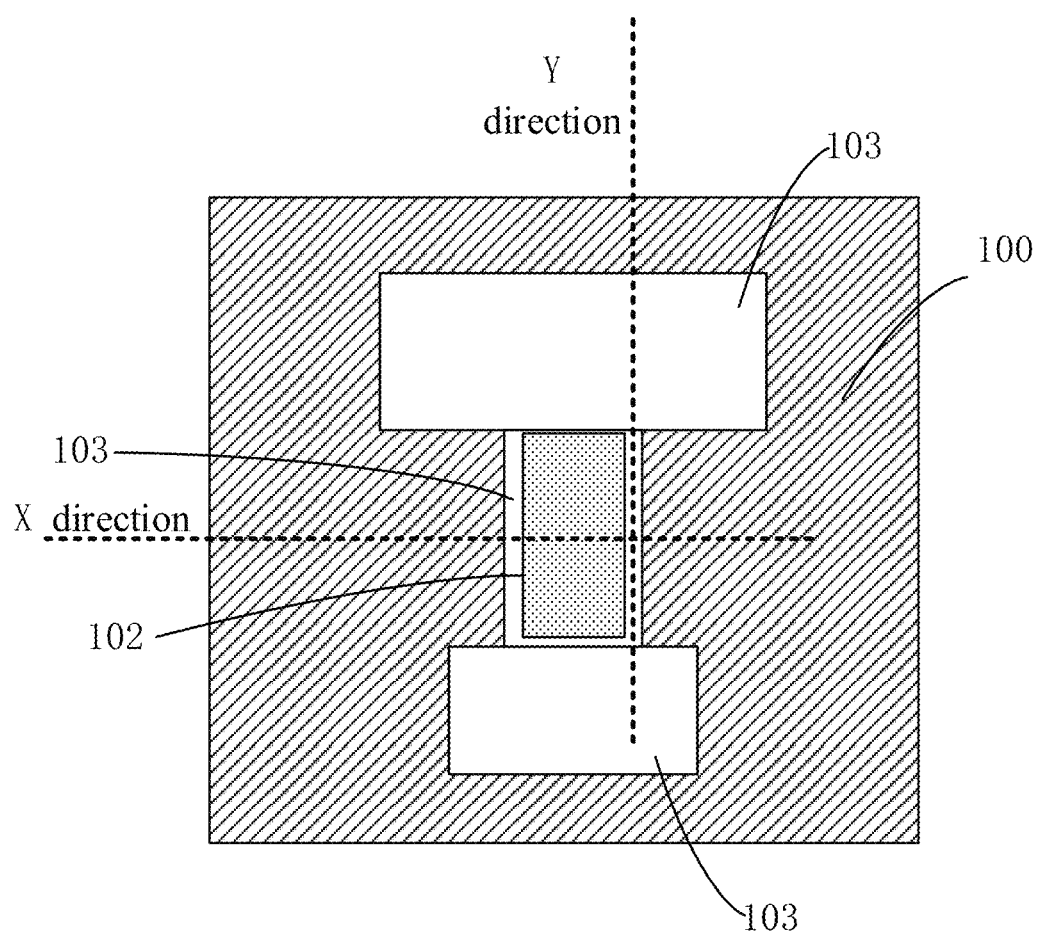
FIG. 3G is a planar structural diagram after forming an oxide layer according to an embodiment of the present disclosure.
Figure 3H:
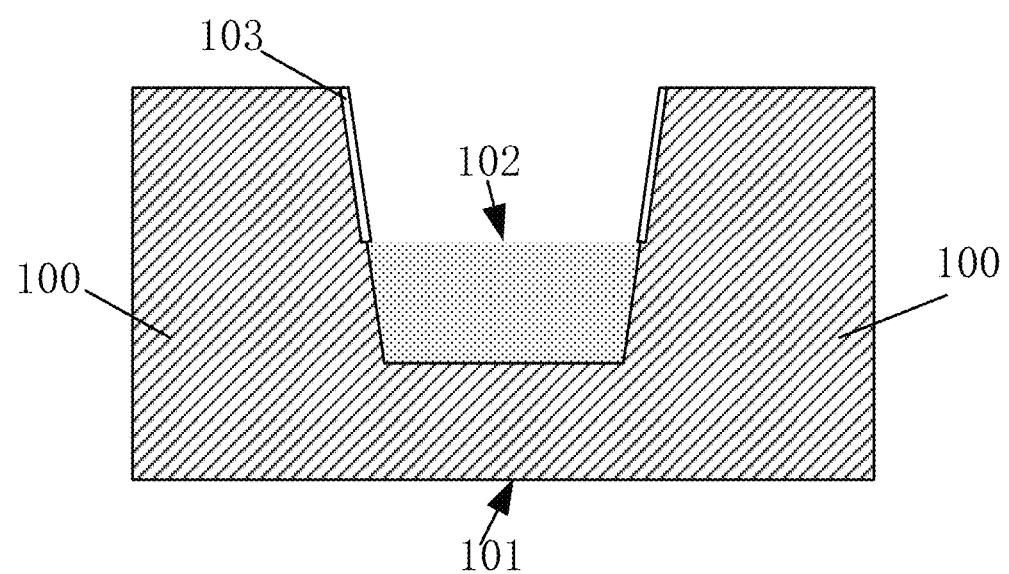
FIG. 3H is a cross-sectional structural diagram after forming the oxide layer according to an embodiment of the present disclosure in the X direction.
Figure 3I:
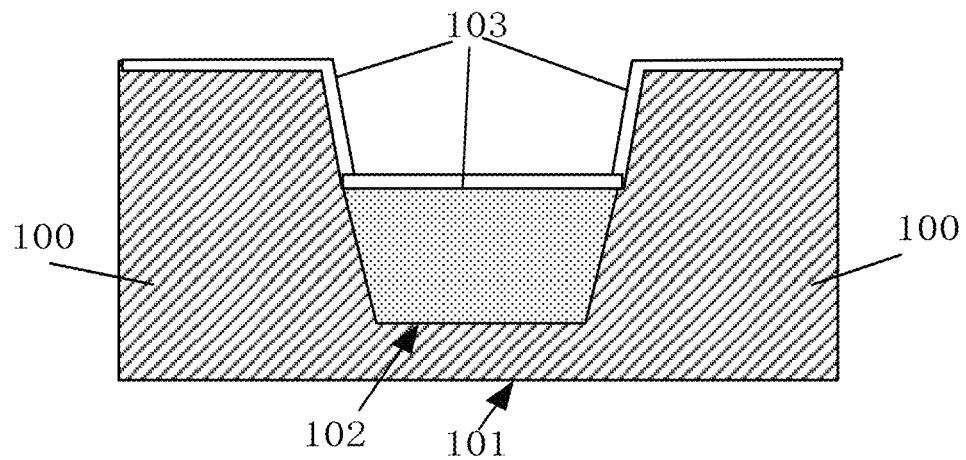
FIG. 3I is a cross-sectional structural diagram after forming the oxide layer according to an embodiment of the present disclosure in the Y direction.

FIG. 3G is a planar structural diagram after forming an oxide layer according to an embodiment of the present disclosure; FIG. 3H is a cross-sectional structural diagram after forming the oxide layer according to an embodiment of the present disclosure in the X direction; FIG. 3I is a cross-sectional structural diagram after forming the oxide layer according to an embodiment of the present disclosure in the Y direction. As shown in FIGS. 3G-3I, in this embodiment, since the positive electrode, the negative electrode, and the fuse links all include an oxide layer as described above, an oxide layer 103 may be formed on the side walls A and the upper surface of the preset active region 100 by an oxidation generation process of silicon, including partial regions of the isolating region close to the side walls A, i.e., the junctions P.

As described above, since the isolating medium of the isolating region 120 is formed by the oxidation generation process of silicon, the oxide layer 103 cannot be further formed by the oxidation generation process of silicon on other surface regions of the isolating region except the partial regions. However, in other embodiments, the oxide layer 103 may be formed by a deposition process on the other surface regions of the isolating region except the partial regions.

Figure 3J:
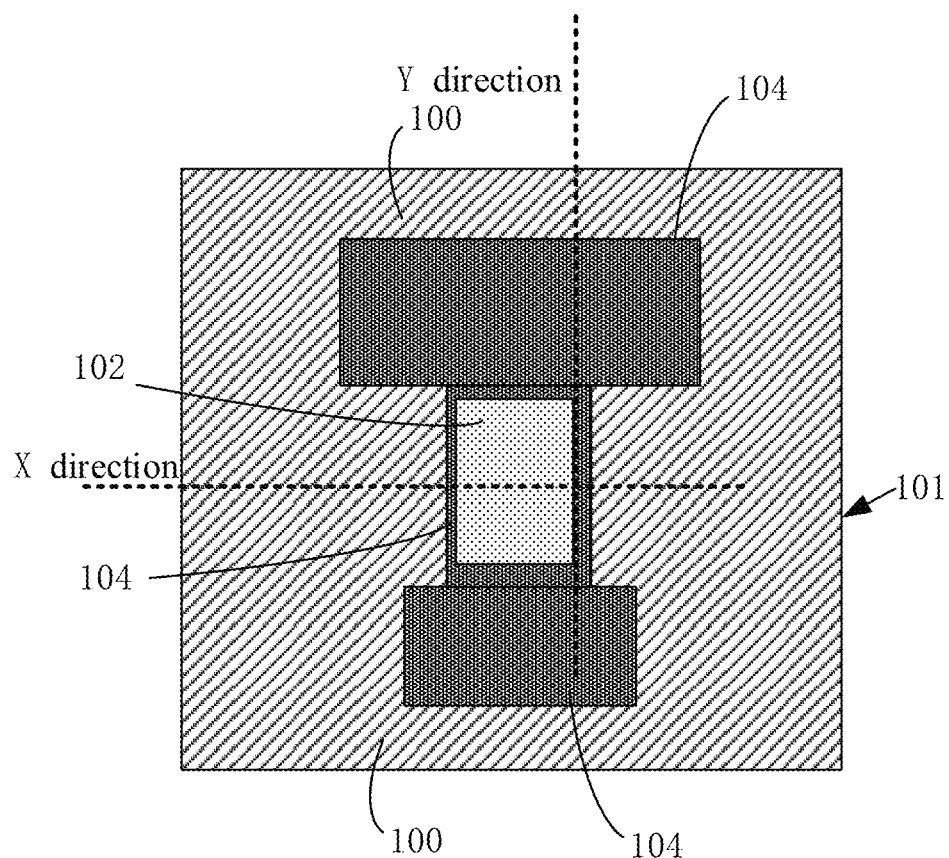
FIG. 3J is a planar structural diagram after forming a parasitic polysilicon layer according to an embodiment of the present disclosure.
Figure 3K:
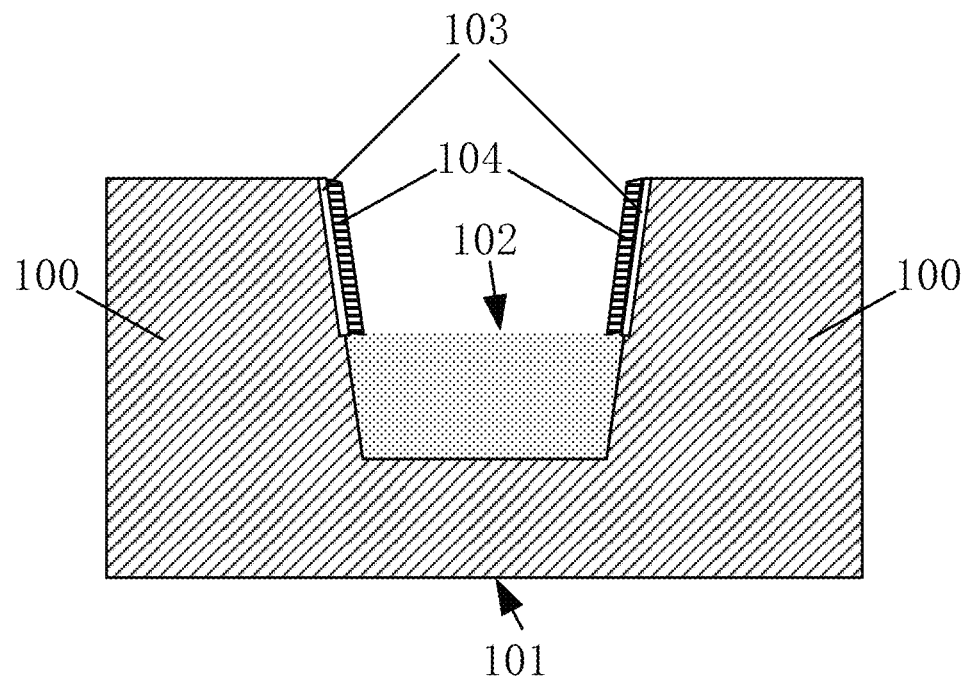
FIG. 3K is a cross-sectional structural diagram after forming the parasitic polysilicon layer according to an embodiment of the present disclosure in the X direction.
Figure 3L:
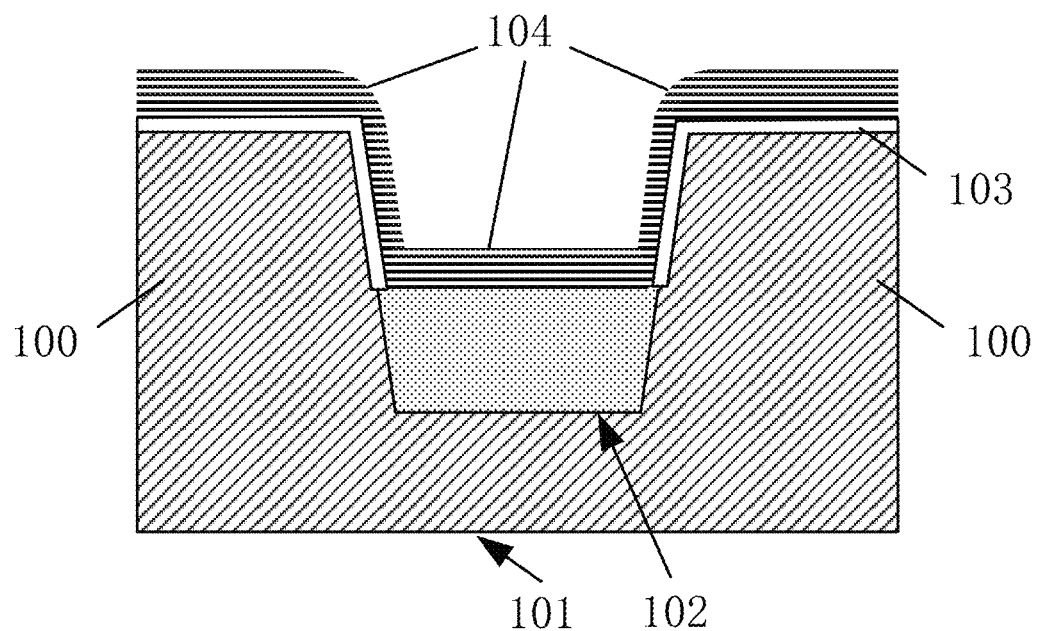
FIG. 3L is a cross-sectional structural diagram after forming the parasitic polysilicon layer according to an embodiment of the present disclosure in the Y direction.

FIG. 3J is a planar structural diagram after forming a parasitic polysilicon layer according to an embodiment of the present disclosure; FIG. 3K is a cross-sectional structural diagram after forming the parasitic polysilicon layer according to an embodiment of the present disclosure in the X direction; FIG. 3L is a cross-sectional structural diagram after forming the parasitic polysilicon layer according to an embodiment of the present disclosure in the Y direction. As shown in FIGS. 3J-3L, a parasitic polysilicon layer 104 is formed on the upper surface of the oxide layer 103. Viewed from the cross-sectional structure regardless in the X direction or the Y direction, the polysilicon layer 104 covers the junctions P of the isolating region 102 and the preset active region, the side walls A, and the upper surface of the preset active region 100.

The cross-sectional structural diagram in the X direction and the cross-sectional structural diagram in the Y direction after the metal silicide layer 105 is formed on the upper surface of the polysilicon layer 104 are as shown in FIGS. 1B and 1C described above.

After the negative electrode and the positive electrode are formed, the connecting units 106 connected with external circuits are formed on the negative electrode and the positive electrode.

In this embodiment, the connecting units 106 are specifically contact holes (in this case, the connecting units 106 are also called Contacts), which are formed by a standard MOS inter layer contact manufacturing process, including an inter layer dielectric deposition process, a contact lithography process, an etching process, a process of metal deposition in contacts, a grinding (chemical mechanical grinding) process, etc.

In addition, each layer of metal interconnection lines and interlayer dielectrics (not shown) may also be formed by a standard MOS back-end process.

Optionally, in this embodiment, the standard MOS back-end process may specifically include a back-end inter metal dielectric deposition process, an inter metal via process, a metal deposition process for forming metal wires, a photolithography and etching process, as well as a grinding process, etc.

Specifically, the connecting units 106 are further located between the adjacent upper and lower layers of metal interconnection lines, and the connecting units 106 are electrically connected to the adjacent upper and lower layers of metal interconnection lines. An upper layer of metal interconnection lines is formed over the connecting units 106 by metal deposition (e.g., AlCu alloy), photolithography and etching.

Specifically, after a first layer of metal interconnection lines (i.e., the lower metal interconnection lines) is formed from bottom to top, a plurality of layers of similar metal interconnection lines are generally formed as needed; for example, the first layer of metal interconnection lines (not shown) is directly formed on the upper surface of the metal polysilicon layer 105, the connecting units 106 are then formed on the first layer of metal interconnection lines (in this case, the connecting units 106 are also called as via), the periphery of the connecting units is surrounded by a dielectric layer, the dielectric layer here is referred to as an inter layer dielectric, a second layer of metal interconnection lines (i.e., upper metal interconnection lines) is formed over the connecting units by the same process, and so on. The specific number of layers of metal interconnection lines is determined by the needs of a circuit itself.

In the related art, as standard polysilicon etching is performed when the preset active region and the isolating region are at the same horizontal plane, the line width of the e-fuse is limited by the limit line width (or the minimum line width) of the semiconductor process, that is, cannot be smaller than the limit line width of the semiconductor process. In this embodiment, since the preset active region and the isolating region have a height difference and are connected by the side walls, a part of polysilicon layer or a parasitic part of polysilicon layer remains on the side walls during polysilicon etching, then a metal polysilicon layer is formed, and fuse links are finally formed, where no special process is required to form the fuse links, so that the line width of the fuse links is not affected by the limit line width of the semiconductor process, and the actual line width of the e-fuse is much smaller than the line width of the e-fuse defined by normal lithography in the related art. Especially in the semiconductor process of the same platform, an e-fuse having a line width smaller than the limit line width of the semiconductor process can be manufactured, and further, a transistor structure as its control unit is also small, thereby reducing the area occupied by a single memory cell and improving the storage capacity of a memory.

Figure 4A:
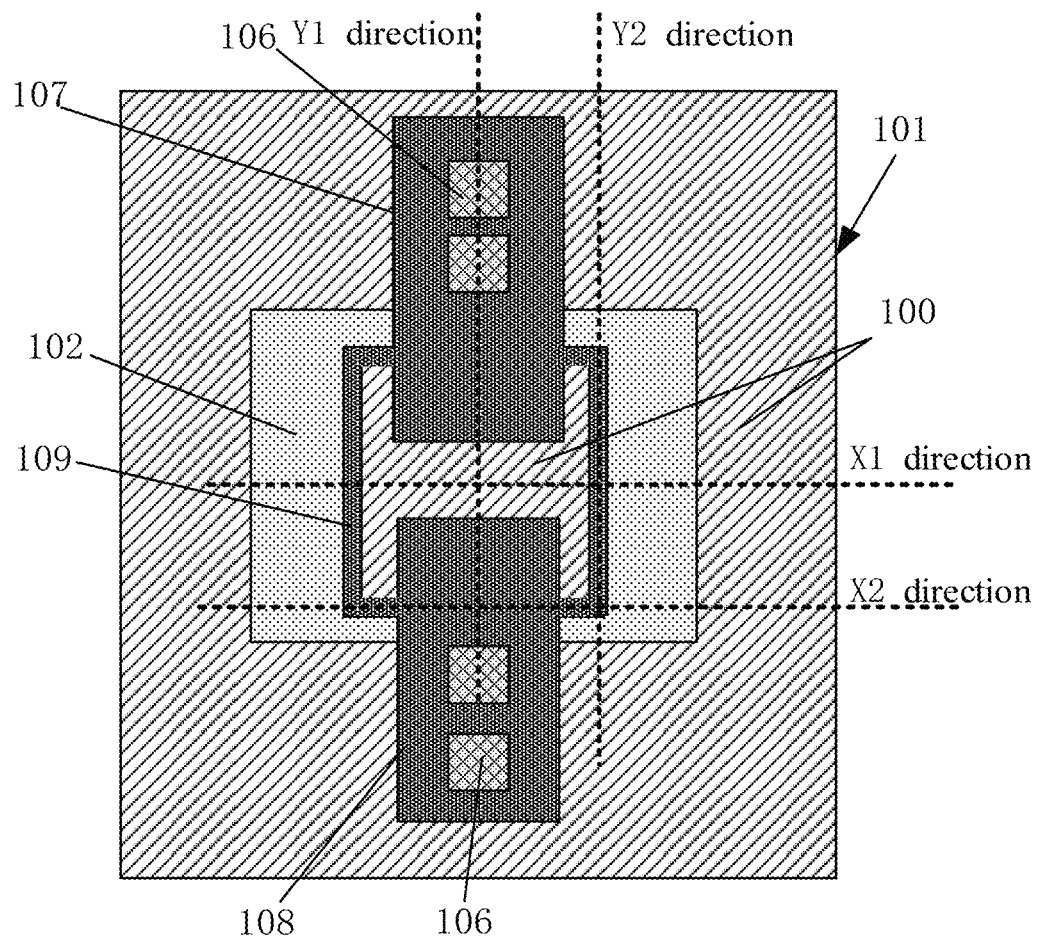
FIG. 4A is a planar structural diagram of an e-fuse according to a third embodiment of the present disclosure.
Figure 4B:
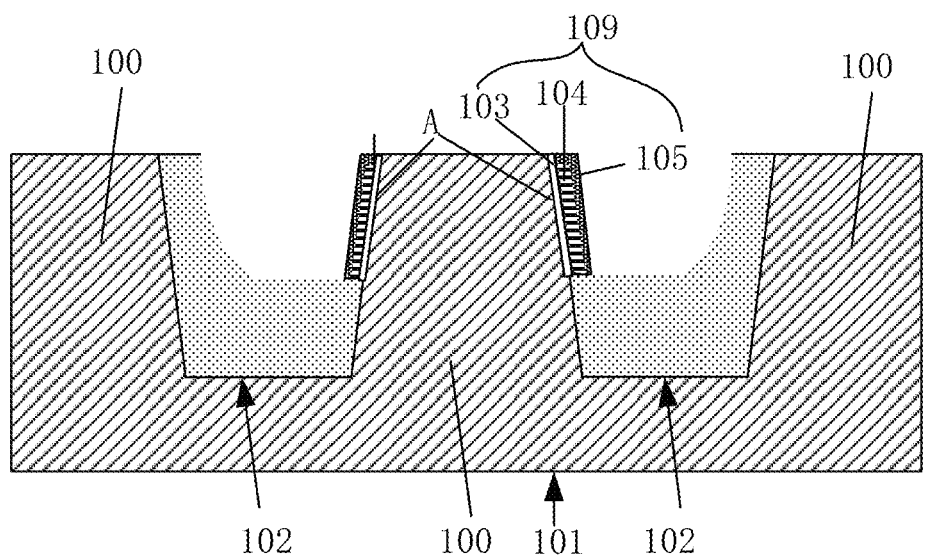
FIG. 4B is a cross-sectional structural diagram of the e-fuse shown in FIG. 4A in the X1 direction.
Figure 4C:
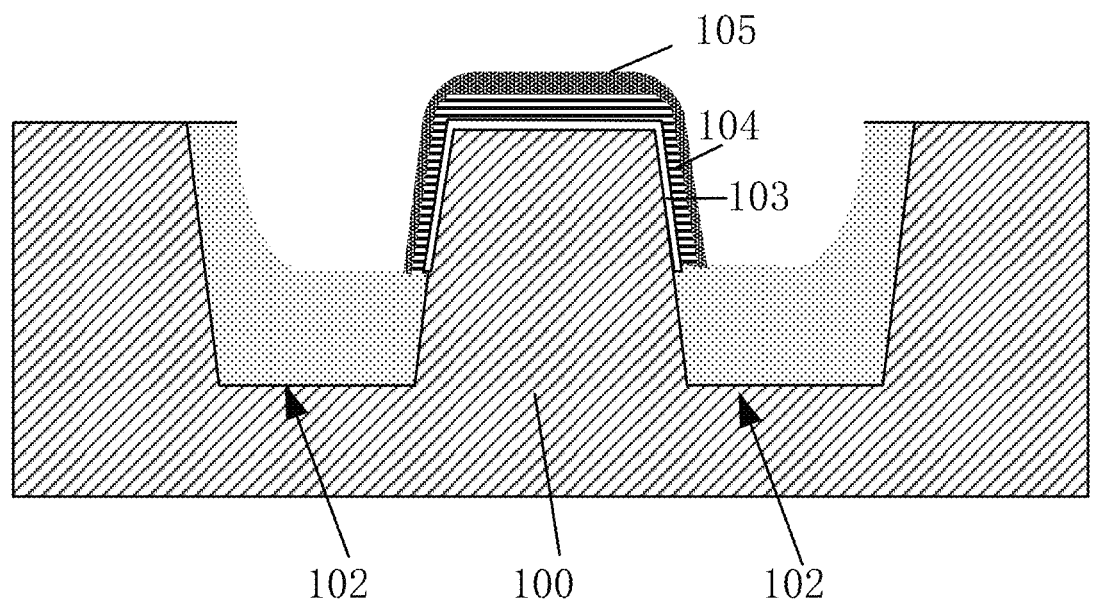
FIG. 4C is a cross-sectional structural diagram of the e-fuse shown in FIG. 4A in the X2 direction.
Figure 4D:
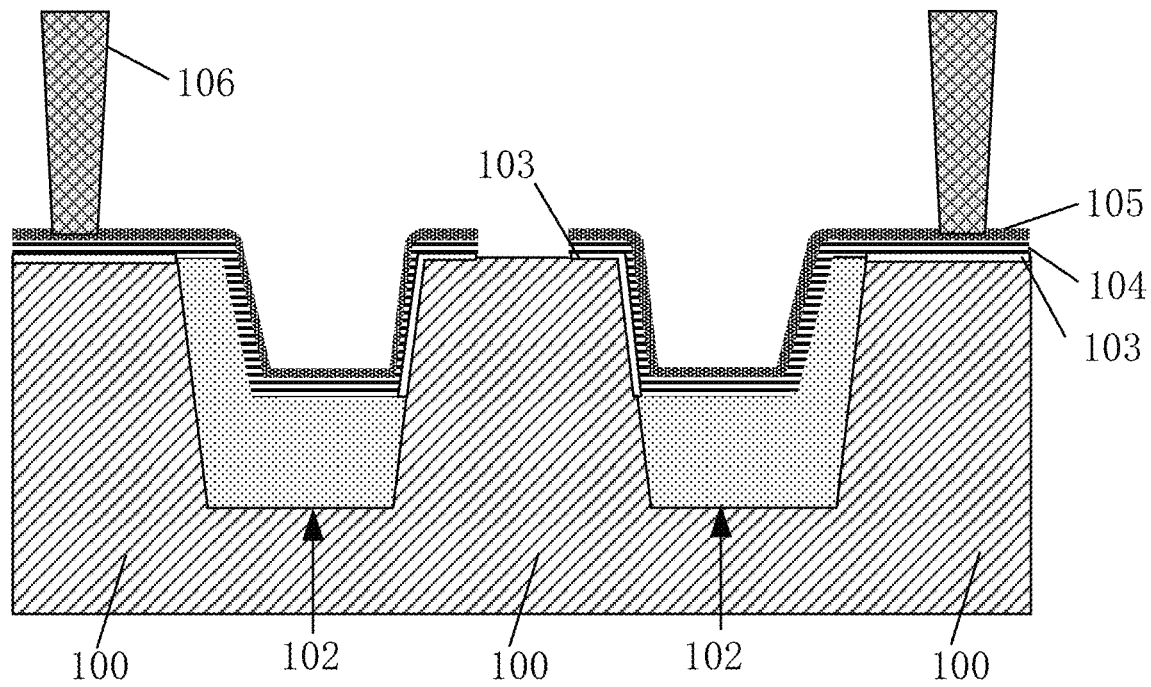
FIG. 4D is a cross-sectional structural diagram of the e-fuse shown in FIG. 4A in the Y1 direction.
Figure 4E:
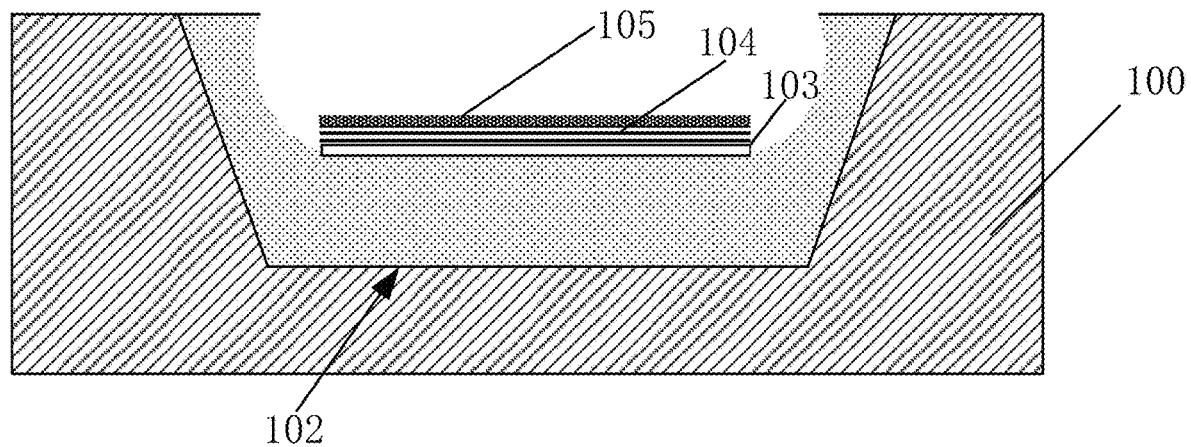
FIG. 4E is a cross-sectional structural diagram of the e-fuse shown in FIG. 4A in the Y2 direction.

FIG. 4A is a planar structural diagram of an e-fuse according to a third embodiment of the present disclosure; FIG. 4B is a cross-sectional structural diagram of the e-fuse shown in FIG. 4A in the X1 direction; FIG. 4C is a cross-sectional structural diagram of the e-fuse shown in FIG. 4A in the X2 direction; FIG. 4D is a cross-sectional structural diagram of the e-fuse shown in FIG. 4A in the Y1 direction; FIG. 4E is a cross-sectional structural diagram of the e-fuse shown in FIG. 4A in the Y2 direction. As shown in FIGS. 4A-4E, in this embodiment, the hollow square trench is filled with an isolating medium to form isolating regions. Since the isolating regions are formed by filling the hollow square trench with the isolating medium, two isolating regions and two preset active regions are formed, two height differences are formed accordingly, and the values of the two height differences may be the same or different. The fusing current is still in the Y direction. Compared with FIG. 1A and its corresponding cross-sectional structural diagrams, in the e-fuse structure shown in FIG. 4A, an intermediate preset active region 100 is formed between the two isolating regions 102, and another preset active region 100 (also referred to as a peripheral preset active region 100) is formed on the periphery of the two isolating regions 102. The intermediate preset active region 100 is specifically located between the two isolating regions 102, and an oxide layer 103, a polysilicon layer 104 and a metal silicide layer 105 of fuse links are formed on the side walls A between the intermediate active region 100 and the two isolating regions 102 respectively. A negative electrode 107, a positive electrode 108, and connecting units 106 are respectively formed on the preset active regions 100 at the upper and lower ends of the e-fuse in the Y1 direction.

Referring to the above method in FIG. 2 for manufacturing the e-fuse shown in FIG. 1A. the specific process in each step is similar to the corresponding step of FIG. 2, except that:

Referring to the above embodiment, two trenches (for forming isolating regions 102 later), a preset active region 100 between the two trenches, and a preset active region 100 at the upper and lower ends of the e-fuse in the Y1 direction are formed on the semiconductor substrate 101 (as shown in FIG. 4A).

Referring to the above embodiment, when the isolating regions of FIG. 4A are formed, the two trenches for forming the two isolating regions 102 are respectively filled with an isolating medium, so that the left and right isolating regions on the semiconductor substrate 101 in the X1 direction respectively have a height difference with the intermediate preset active region 100, and a side wall A is respectively formed between the intermediate preset active region 100 and the left and right isolating regions 102 (shown in FIG. 4B).

Referring to the above embodiment, when fuse links of FIG. 4A are formed, an oxide layer 103 is formed on the side walls A between the intermediate preset active region 100 and the left and right isolating regions 102 respectively in the X2 direction (shown in FIG. 4C), a polysilicon layer is formed on the oxide layer 103 and the left and right adjacent junctions (as shown in FIG. 4E) between the intermediate preset active region 100 and the left and right isolating regions 102, the polysilicon layer is etched to obtain a residual polysilicon layer 104, and a metal silicide layer 105 is formed on the residual polysilicon layer 104.

Referring to the above embodiment, when the fuse links of FIG. 4A are formed, a metal silicide layer 105 and electrical connecting units 106 are sequentially formed on the residual polysilicon layer 104 on the side walls A between the intermediate preset active region 100 and the left and right isolating regions 102 in the Y1 direction (shown in FIG. 4D), so that the positive electrode, the negative electrode, and the fuse links can be synchronously formed by the same process.

Figure 5:
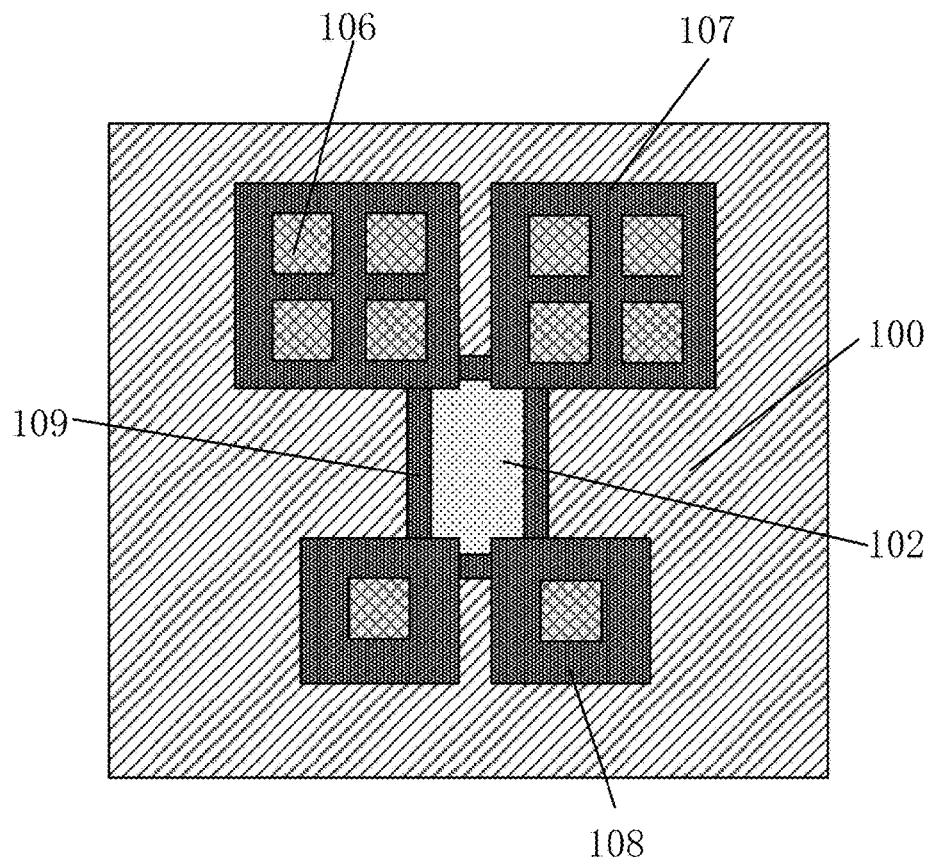
FIG. 5 is a planar structural diagram of an e-fuse according to a fourth embodiment of the present disclosure.

FIG. 5 is a planar structural diagram of an e-fuse according to a fourth embodiment of the present disclosure. Based on the planar structural diagram, FIG. 5 differs from FIG. 1A in that, in the Y direction of the e-fuse, two negative electrodes 107 and two positive electrodes 108 are respectively disposed on the preset active region 100 at the upper and lower ends, each negative electrode 107 has four connecting units 106, and each positive electrode 108 has one connecting unit 106. The number of the connecting units 106 in the schematic diagram is not specifically limited. In specific operation, dozens of or a dozen of connecting units 106 may be provided, depending on the magnitude of the required fusing current.

The e-fuse shown in FIG. 5 may be manufactured with reference to the manufacturing method shown in FIG. 2 by changing only the deposition and etching opening regions of polysilicon, and the specific deposition and etching are referenced to the description of the above embodiments.

Figure 6:
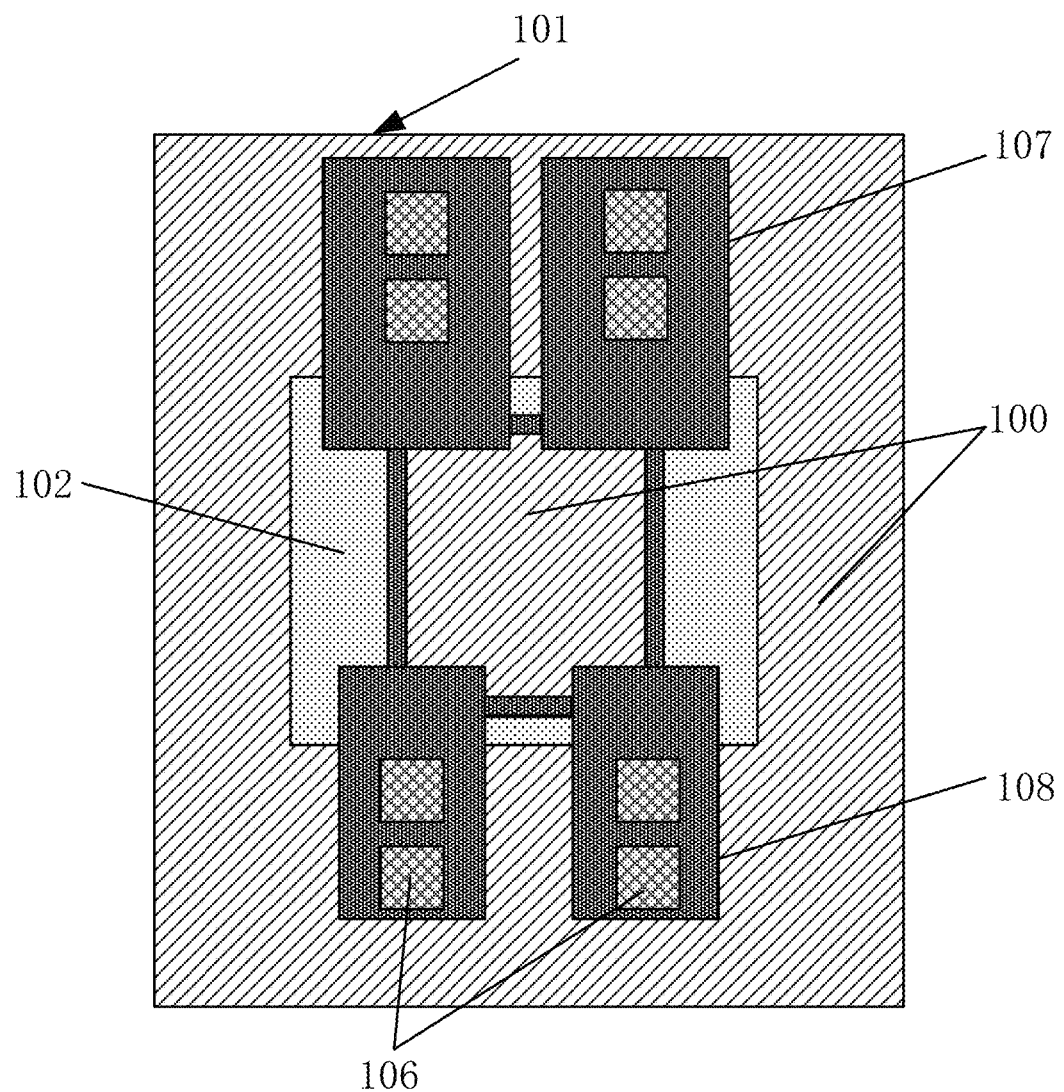
FIG. 6 is a planar structural diagram of an e-fuse according to a fifth embodiment of the present disclosure.

FIG. 6 is a planar structural diagram of an e-fuse according to a fifth embodiment of the present disclosure. Based on the planar structural diagram, FIG. 6 differs from FIG. 4A in that, in the Y direction of the e-fuse, two negative electrodes 107 and two positive electrodes 108 are respectively disposed on the preset active region 100 at the upper and lower ends, each negative electrode 107 has two connecting units 106, and each positive electrode 108 has two connecting units 106. The e-fuse shown in FIG. 5 may be manufactured with reference to the manufacturing method of the e-fuse shown in FIG. 4A by changing only the deposition and opening regions of polysilicon.

In the above embodiments of the present disclosure, from the perspective of the planar structural diagrams, a pair of negative and positive electrodes corresponds to the left and right fuse links in FIG. 1A and FIG. 4A, so programming can be implemented only when the left and right fuse links are both fused. In FIG. 5 and FIG. 6, a pair of negative and positive electrodes corresponds to one fuse link, so programming can be implemented as long as one of the fuse links is fused. Of course, the structures of FIG. 5 and FIG. 6 can also be interpreted as the structures of two e-fuses.

In addition, it can be seen from the above embodiments that, when two side walls are provided, a total of two fuse links are disposed on the two side walls, and the two fuse links are connected between at least one negative electrode and at least one positive electrode.

Finally, it should be noted that the above embodiments are merely intended to describe the technical solutions according to the embodiments of the present disclosure, instead of limiting the present disclosure. Although the present disclosure is described in detail with reference to the above embodiments, persons of ordinary skill in the art should understand that various modifications may be made to the technical solutions described in the above embodiments or equivalent replacements may be made to some technical features thereof, without departing from the spirit and scope of the technical solutions of the embodiments of the present disclosure.

What is claimed is:

1. A method for manufacturing an e-fuse, comprising:
providing a semiconductor substrate, the semiconductor substrate comprising a preset active region;
forming an isolating region on the semiconductor substrate, wherein the isolating region and the preset active region have a height difference and are connected by at least one side wall;
forming a negative electrode and a positive electrode on the preset active region; and
forming a fuse link on the side wall for connecting the negative electrode and the positive electrode.

2. The method according to claim 1, wherein the forming an isolating region on the semiconductor substrate comprises:
forming a trench extending downward from an upper surface of the semiconductor substrate, wherein a bottom surface of the trench forms the isolating region, and a side wall of the trench is used to connect the isolating region with the preset active region.

3. The method according to claim 2, wherein the forming a trench extending downward from an upper surface of the semiconductor substrate comprises: processing the upper surface of the semiconductor substrate downward to form the trench by photolithography and etching.

4. The method according to claim 2, wherein the bottom surface of the trench forming the isolating region comprises:
filling the trench with an isolating medium;
removing part of the isolating medium in the trench to form the isolating region, and causing the isolating region and the preset active region to have a height difference and to be connected by the at least one side wall.

5. The method according to claim 1, wherein the forming the fuse link on the at least one side wall for connecting the negative electrode and the positive electrode comprises:
sequentially forming an oxide layer, a polysilicon layer and a metal silicide layer on the at least one side wall to form the fuse link.

6. The method according to claim 5, wherein the metal silicide layer comprises at least one of a titanium metal silicide, a cobalt metal silicide, and a tungsten metal silicide.

7. The method according to claim 1, wherein the forming an oxide layer, a polysilicon layer and a metal silicide layer on the at least one side wall comprises: etching the polysilicon layer to form a residual or parasitic polysilicon layer, and forming a metal silicide layer on the surface of the residual or parasitic polysilicon layer.

8. The method according to claim 1, wherein the forming a negative electrode and a positive electrode on the preset active region comprises: forming an oxide layer, a polysilicon layer, and a metal silicide layer on the active region to form the negative electrode and the positive electrode.

9. The method according to claim 8, wherein the metal silicide layer comprises at least one of a titanium metal silicide, a cobalt metal silicide, and a tungsten metal silicide.

10. The method according to claim 1, further comprising: forming connecting units on the negative electrode and the positive electrode for connecting with external circuits.

11. An e-fuse, comprising:
a semiconductor substrate;
a negative electrode;
a positive electrode; and
a fuse link for electrically connecting the negative electrode and the positive electrode,
wherein the semiconductor substrate comprises a preset active region, and the negative electrode and the positive electrode are formed on the preset active region; an isolating region is formed on the semiconductor substrate, the isolating region and the preset active region have a height difference and are connected by at least one side wall, and the fuse link is formed on the at least one side wall.

12. The e-fuse according to claim 11, wherein the negative electrode, the positive electrode and the fuse link each comprise an oxide layer, a polysilicon layer, and a metal silicide layer.

13. The e-fuse according to claim 11, wherein the isolating region is formed by filling a square-shaped trench or a hollow square trench with an isolating medium.

14. The e-fuse according to claim 13, wherein the isolating region is formed by filling a square-shaped trench with an isolating medium, and only one isolating region and only one preset active region are formed.

15. The e-fuse according to claim 13, wherein the isolating region is formed by filling a hollow square trench with an isolating medium, and two isolating regions and two preset active regions are formed.

16. The e-fuse according to claim 13, wherein the fuse link is formed on the at least one side wall in the direction of fusing current for the e-fuse.

17. The e-fuse according to claim 11, wherein the at least one side wall comprises two side walls, a total of two fuse links are disposed on the two side walls, and the two fuse links are connected between the negative electrode and the positive electrode.

18. A memory cell, comprising an e-fuse formed on a semiconductor substrate, wherein the e-fuse comprises:
a negative electrode, formed on a preset active region of the semiconductor substrate;
a positive electrode, formed on the preset active region; and
a fuse link for electrically connecting the negative electrode and the positive electrode, wherein an isolating region is formed on the semiconductor substrate, the isolating region and the preset active region have a height difference and are connected by at least one side wall, and the fuse link is formed on the side wall.

19. The memory cell according to claim 18, wherein the at least one side wall comprises two side walls, a total of two fuse links are disposed on the two side walls, and the two fuse links are connected between the negative electrode and the positive electrode.

20. The memory cell according to claim 18, wherein the isolating region is formed by filling a square-shaped trench or a hollow square trench with an isolating medium.

* * * * *